(12) United States Patent
Morikazu (10) Patent No.: US 10,083,849 B2
(45) Date of Patent: Sep. 25, 2018

(54) METHOD OF PROCESSING WAFER (71) Applicant: DISCO CORPORATION, Tokyo (JP)

(72) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 9 days.

(21) Appl. No.: 15/367,558

(22) Filed: Dec. 2, 2016

(65) Prior Publication Data

US 2017/0162420 A1    Jun. 8, 2017

(30) Foreign Application Priority Data

Dec. 4, 2015 (JP) .................. 2015-237184

(51) Int. Cl.
| | | |
|---|---|---|
| H01L 21/46 | (2006.01) | |
| H01L 21/683 | (2006.01) | |
| H01L 21/304 | (2006.01) | |
| H01L 21/78 | (2006.01) | |
| H01L 23/544 | (2006.01) | |

(52) U.S. Cl.
CPC ........ H01L 21/6836 (2013.01); H01L 21/304 (2013.01); H01L 21/6835 (2013.01); H01L 21/78 (2013.01); H01L 23/544 (2013.01); *H01L 2221/6834* (2013.01); *H01L 2221/68327* (2013.01); *H01L 2221/68386* (2013.01); *H01L 2223/5446* (2013.01)

(58) Field of Classification Search
CPC .............................................. H01L 2924/1461
See application file for complete search history.

(56) References Cited

U.S. PATENT DOCUMENTS

| | | | | |
|---|---|---|---|---|
| 8,048,780 B2 * | 11/2011 | Hoshino | ........... | H01L 21/67092 438/458 |
| 2007/0298587 A1 * | 12/2007 | Park | .................. | B23K 26/0732 438/458 |
| 2011/0241178 A1 * | 10/2011 | Miki | .................. | H01L 21/6836 257/620 |

FOREIGN PATENT DOCUMENTS

JP          11-040520          2/1999

* cited by examiner

*Primary Examiner* — Julio J Maldonado
*Assistant Examiner* — Andre' C Stevenson
(74) *Attorney, Agent, or Firm* — Greer Burns & Crain Ltd.

(57) ABSTRACT

A method of processing a wafer includes placing a supporting substrate in confronting relation to a face side of the wafer and integrally bonding the supporting substrate to the face side of the wafer with a bonding material, grinding a reverse side of the wafer to thin the wafer, cutting the wafer along division lines from the reverse side of the wafer into chips that carry individual devices thereon, placing a protective member on the reverse side of the wafer, applying a laser beam having a wavelength which is able to transmit the supporting substrate in the condition where a focused spot of the laser beam is set in the bonding material, thereby breaking the bonding material, and peeling the supporting substrate off from the devices to separate the chips that carry the individual devices thereon.

3 Claims, 7 Drawing Sheets

METHOD OF PROCESSING WAFER

BACKGROUND OF THE INVENTION

Field of the Invention

The present invention relates to a method of processing a wafer in the form of a thin plate with devices formed on a face side thereof by dividing the wafer into chips that carry the individual devices respectively thereon.

Description of the Related Art

Wafers that include a plurality of devices, such as integrated circuits (ICs), large scale integrations (LSIs), power devices formed on a face side thereof in respective areas demarcated by division lines are diced along the division lines and divided into individual device chips by a dividing apparatus such as a laser processing apparatus. The device chips are used in electric devices such as mobile phones, personal computers, or television sets. There have been demands in the art for a technology for reducing the thickness of such device chips with a view to making smaller and lighter mobile phones or wrist watches with a communication function which incorporate those device chips.

One technology that has already been proposed for thinning devices produced by dividing wafers is referred to as dicing before grinding (DBG) (see, for example, Japanese Patent Laid-Open No. 1999-040520). According to the proposed technology, grooves are formed in the face side of a wafer along division lines thereon to a depth corresponding to the finished thickness of device chips, after which a protective member is placed on the face side of the wafer, and then the reverse side of the wafer is ground until the grooves are exposed, whereupon the wafer is divided into individual device chips.

SUMMARY OF THE INVENTION

According to the technology disclosed in Japanese Patent Laid-Open No. 1999-040520, specifically, the grooves which are deeper than the thickness of the completed device chips are initially formed along the division lines in the face side of the wafer where the devices have been formed, and then a sheet is applied as the protective member to the face side of the wafer. Then, the wafer is held on a chuck table with the face side thereof facing downwardly, after which the reverse side of the wafer is ground and polished to the thickness of the completed device chips, thereby dividing the wafer into the individual device chips.

If the device chips are of a square shape as small as 1 mm on each side or the wafer is ground to an extent it may be small or thin, i.e., to a thickness of 10 µm or less, then when the wafer is ground, the device chips may be scattered off from the sheet that serves as the protective member or may be broken due to vibrations of a grinding wheel that are transmitted to the wafer and variations in the load imposed on the wafer by the grinding wheel. Therefore, there has been a certain limitation on the efforts to try to reduce the size or thickness of device chips with the DBG technology.

It is therefore an object of the present invention to provide a method of processing a wafer for reducing the size or thickness of device chips to be diced therefrom.

In accordance with an aspect of the present invention, there is provided a method of processing a wafer by dividing a wafer with devices formed on areas on a face side thereof which are demarcated by a plurality of division lines, along the division lines into chips that carry the individual devices thereon, the method including an integrating step of placing a supporting substrate in confronting relation to the face side of the wafer and integrally bonding the supporting substrate to the face side of the wafer with a bonding material; a reverse-side grinding step of grinding a reverse side of the wafer to thin the wafer after performing the integrating step; a cutting step of cutting the wafer along the division lines from the ground reverse side of the wafer into the chips that carry the individual devices thereon; a protective-member placing step of placing a protective member on the reverse side of the wafer which has been cut along the division lines; a bonding-material breaking step of applying a laser beam having a wavelength which is able to transmit the supporting substrate in the condition where a focused spot of the laser beam is set in the bonding material, thereby breaking the bonding material after performing the protective-member placing step; and a supporting-substrate peeling step of peeling the supporting substrate off from the devices to separate the chips that carry the individual devices thereon after performing the bonding-material breaking step.

Preferably, in the protective-member placing step, the wafer is placed in an opening of a frame and the reverse side of the wafer and an outer periphery of the frame are joined to each other by an adhesive tape, so that the adhesive tape is placed as the protective member on the reverse side of the wafer by supporting the wafer on the frame. Preferably, the method of processing a wafer according to the present invention further includes a pickup step of expanding the adhesive tape to expand intervals between the devices, and picking up the devices from the adhesive tape after performing the supporting-substrate peeling step.

Preferably, the cutting step includes any one of a cutting step using a cutting blade, a cutting step using a laser beam, a cutting step using plasma etching, and a cutting step using wet etching.

The method of processing a wafer according to the present invention is capable of grinding the wafer to a thinner configuration without causing devices to be scattered or broken while the wafer is being ground, as compared with conventional methods of processing a wafer on the basis of the DBG technology. As a result, it is possible to produce smaller and thinner individual separate device chips from the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT (Integrating Step)

Figure 1A:
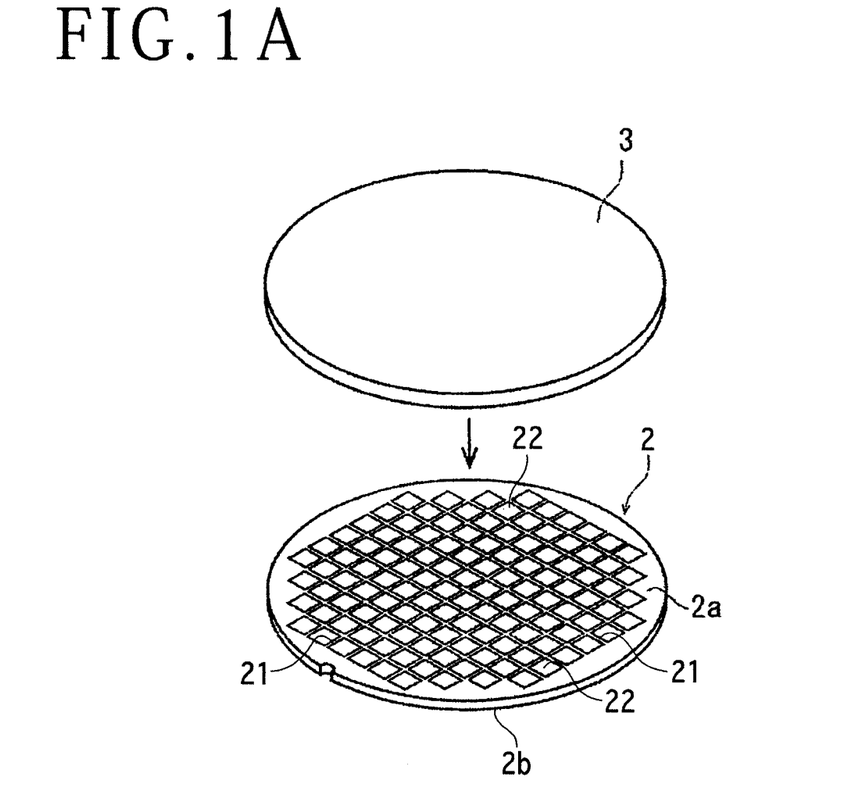
FIGS. 1A and 1B are perspective views showing an integrating step.
Figure 1B:
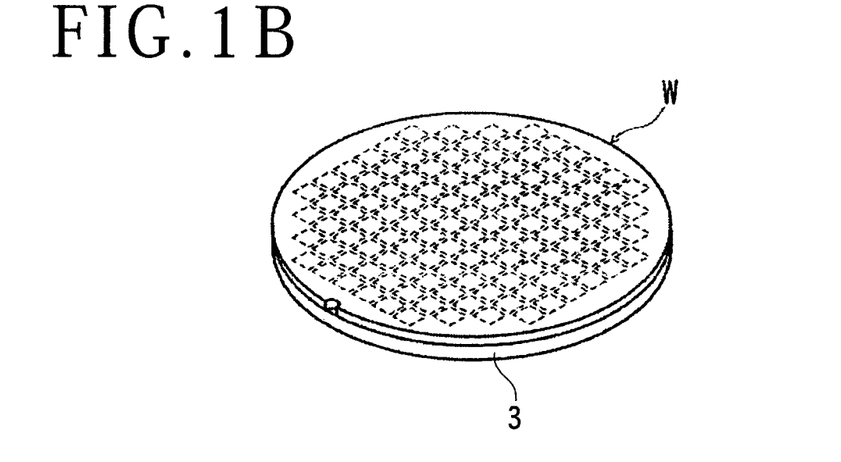

A method of processing a wafer according to an embodiment of the present invention will be described below with reference to the accompanying drawings. First, as shown in FIGS. 1A and 1B, a supporting substrate 3 is bonded to a face side 2a of a semiconductor wafer 2 on which devices 22 are formed, by an adhesive selected from known bonding materials such as epoxy resin or polyimide resin, providing a bonded wafer W (integrating step). The semiconductor wafer 2 includes, for example, a silicon wafer having a thickness of 200 µm. A plurality of division lines 21 are formed in a grid pattern on the face side 2a of the semiconductor wafer 2. The devices 22, which may be ICs, LSIs, or the like, are disposed in respective areas that are demarcated by the division lines 21 on the face side 2a of the semiconductor wafer 2. The supporting substrate 3 is made of a material selected from glass, sapphire, etc., and preferably selected from transparent materials.

(Reverse-side Grinding Step)

Figure 2:
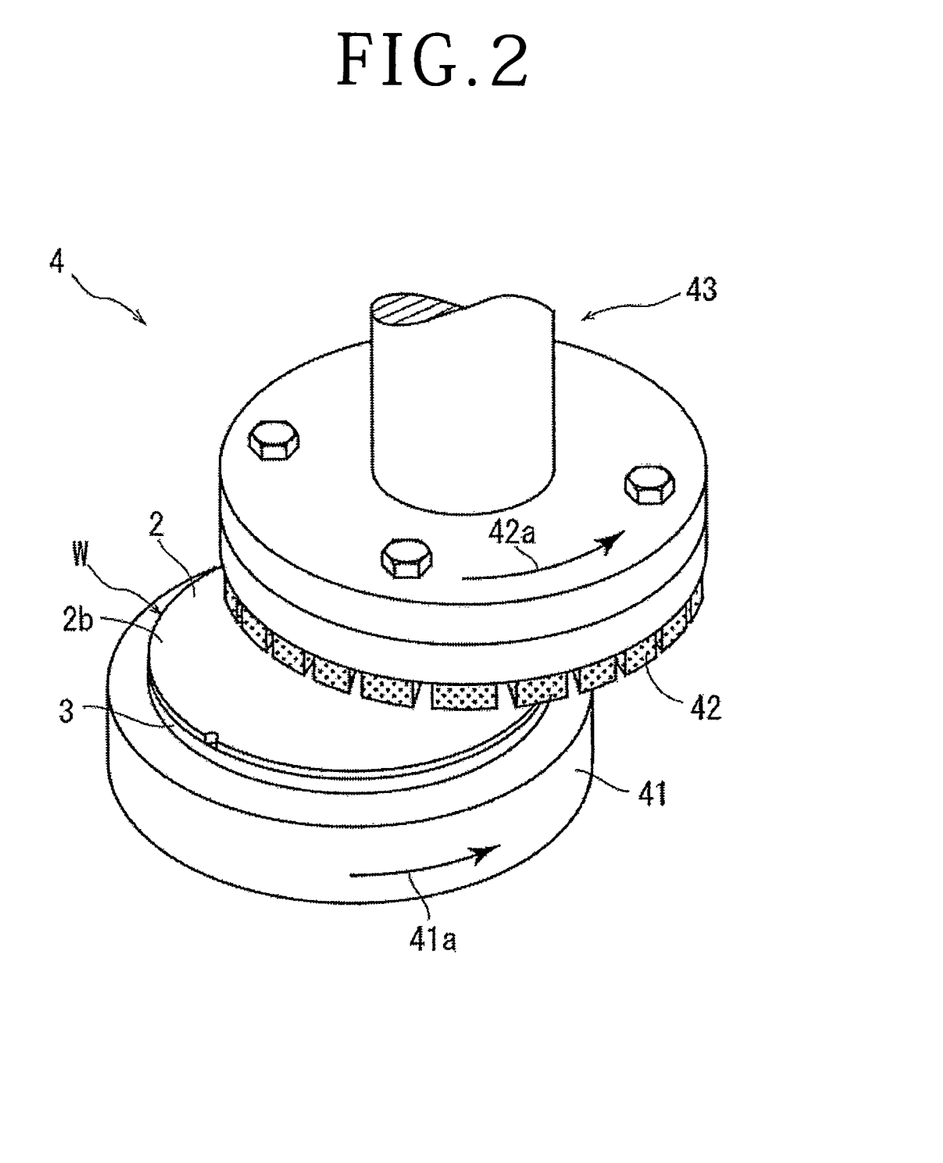
FIG. 2 is a perspective view showing a reverse-side grinding step.

After the semiconductor wafer 2 and the supporting substrate 3 have been integrated together by the bonding material, as described above, a reverse-side grinding step is carried out to grind a reverse side 2b of the semiconductor wafer 2. The reverse-side grinding step is performed using a grinding apparatus 4 shown in FIG. 2. As shown in FIG. 2, the grinding apparatus 4 includes a chuck table 41 for holding a workpiece, i.e., the bonded wafer W, thereon and grinding means 43 including grinding stones 42 for grinding the workpiece that is held on the chuck table 41. For performing the reverse-side grinding step using the grinding apparatus 4, the supporting substrate 3 of the bonded wafer W is placed on the chuck table 41, and suction means, not shown, is actuated to secure the bonded wafer W to the chuck table 41 under suction. Therefore, the bonded wafer W held on the chuck table 41 is secured in place thereon with the reverse side 2b of the semiconductor wafer 2 facing upwardly. After the bonded wafer W has been securely held on the chuck table 41, the chuck table 41 is rotated at 300 rpm, for example, in the direction indicated by an arrow 41a while at the same time the grinding stones 42 of the grinding means 43 is rotated at 6000 rpm, for example, in the direction indicated by an arrow 42a and held in contact with the reverse side 2b of the semiconductor wafer 2, grinding the reverse side 2b down to a predetermined remaining thickness in the range from 5 µm to 10 µm, for example.

(Cutting Step)

After the reverse-side grinding step of grinding the reverse side 2b of the semiconductor wafer 2 has been carried out, a cutting step is carried out to cut the semiconductor wafer 2 from its reverse side 2b along the division lines 21 into chips that carry the individual devices 22 thereon.

Figure 3A:
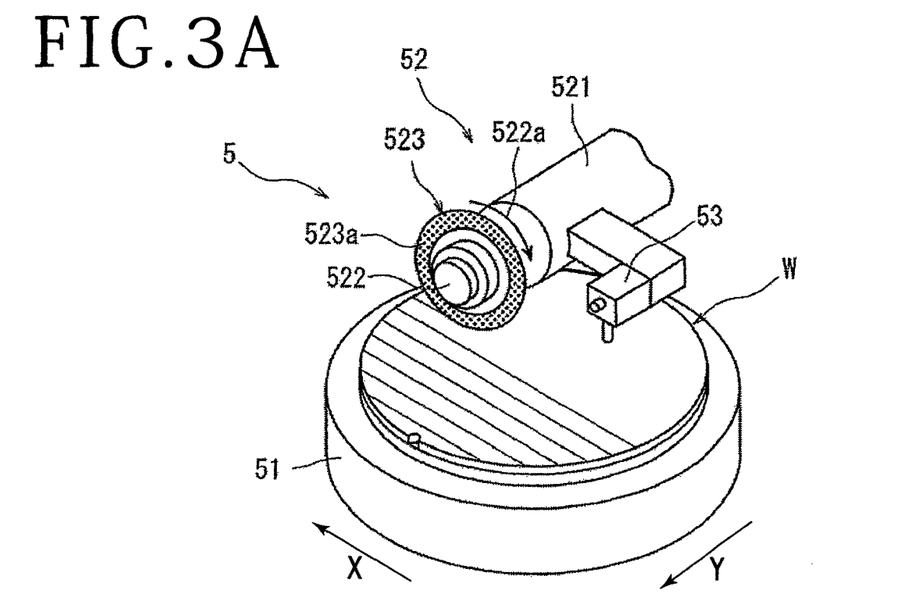
FIGS. 3A through 3C are perspective views showing a cutting step.

The cutting step is performed using a cutting apparatus 5 shown in FIG. 3A. As shown in FIG. 3A, the cutting apparatus 5 includes a chuck table 51 for holding a workpiece, i.e., the bonded wafer W, thereon, cutting means 52 for cutting the workpiece held on the chuck table 51, and image-capturing means 53 for capturing an image of the workpiece held on the chuck table 51. The chuck table 51 is arranged to hold the workpiece under suction thereon, and is movable in the cutting-feed direction indicated by an arrow X in FIG. 3A by cutting-feed means, not shown.

The cutting means 52 includes a spindle housing 521 extending substantially horizontally, a spindle 522 rotatably supported by the spindle housing 521, and a cutting blade 523 mounted on the tip end of the spindle 522 and having an annular cutting edge 523a. The spindle 522 is rotatable in the direction indicated by an arrow 522a by a servomotor, not shown, disposed in the spindle housing 521. The image-capturing means 53 includes a microscope, infrared-ray applying means, optical means such as an infrared charge coupled device (CCD) camera, etc. The image-capturing means 53 sends a captured image signal to control means, not shown, which performs image processing such as pattern matching to positionally align one of the division lines 21 on the face side 2a of the semiconductor wafer 2 with the cutting blade 523, thereby achieving alignment of an area to be cut. If the semiconductor wafer 2 has through electrodes extending from the face side 2a onto the reverse side 2b, then the alignment process may be carried out with reference to the through electrodes.

Figure 3B:
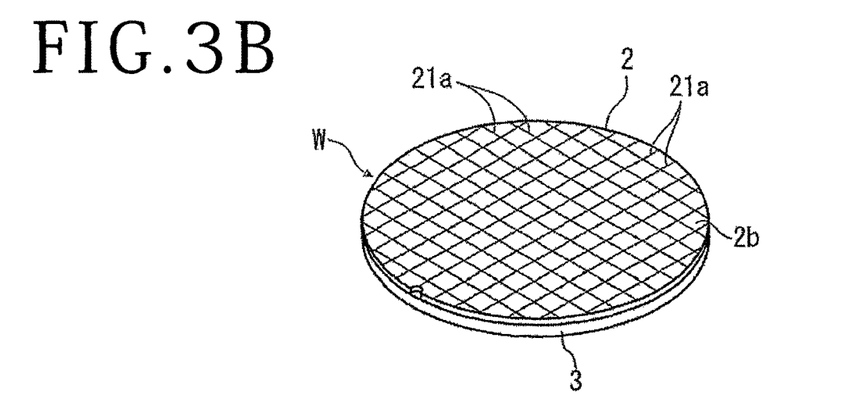
Figure 3C:
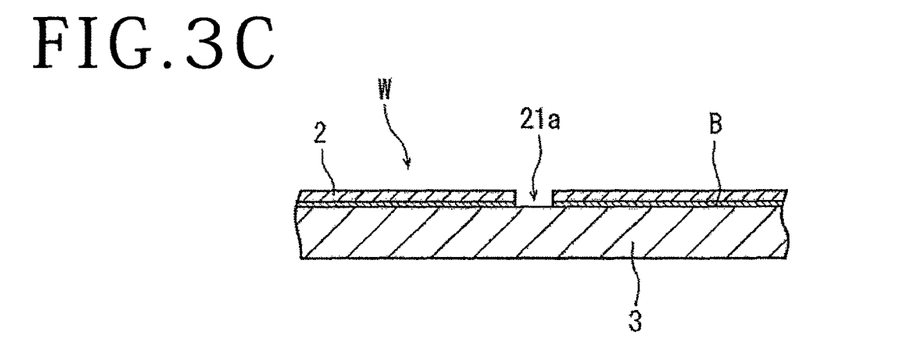

After the above alignment process, the chuck table 51 that is holding the bonded wafer W thereon is moved to a cutting-start position for starting to cut the area to be cut. In the cutting-start position, the cutting blade 523 is incising-fed downwardly and rotated at a predetermined speed while at the same time the chuck table 51 is moved at a predetermined cutting-feed speed in the direction indicated by the arrow X to a cutting-ending position in the direction indicated by the arrow X, thereby forming a cut groove 21a in the semiconductor wafer 2 from the reverse side 2b thereof (cut-groove forming step), whereupon the chuck table 51 stops moving. The cutting blade 523 is then lifted, and the chuck table 51 is indexing-fed in the direction indicated by an arrow Y (indexing-feed direction) until another division line 21 along which to cut the bonded wafer W is positioned in alignment with the cutting blade 523, followed by the cut-groove forming step described above (see FIG. 3A). The cut-groove forming step is carried out along all the division lines 21 on the semiconductor wafer 2 (see FIG. 3B). In the present embodiment, the depth to which the cutting blade 523 cuts the bonded wafer W is set so as to cut the semiconductor wafer 2. However, if necessary, the depth to which the cutting blade 523 cuts the bonded wafer W may be set so as to also cut a bonding material B, which serves as the adhesive by which the supporting substrate 3 is bonded to the semiconductor wafer 2. The cutting step is now finished.

(Protective-member Placing Step)

Figure 4:
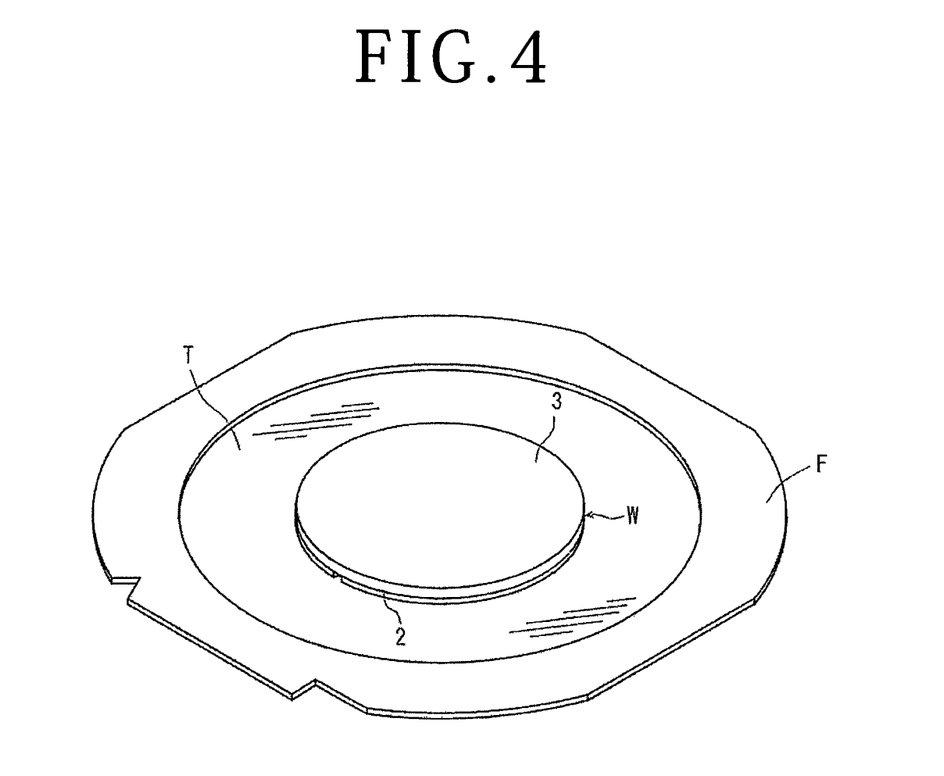
FIG. 4 is a perspective view showing a protective-member placing step.

The above cutting step performed on the semiconductor wafer 2 is followed by a protective-member placing step in which an adhesive tape T is applied as a protective member to the reverse side 2b of the semiconductor wafer 2. Specifically, as shown in FIG. 4, the semiconductor wafer 2, i.e., the reverse side 2b of the semiconductor wafer 2, is applied to a face side of the adhesive tape T that serves as the protective member whose outer peripheral portion is mounted on an annular frame F so that the adhesive tape T covers the inner opening of the annular frame F. The protective-member placing step is now finished. The bonded wafer W applied to the adhesive tape T has its supporting substrate 3 facing upwardly.

(Bonding-material Breaking Step)

Figure 5A:
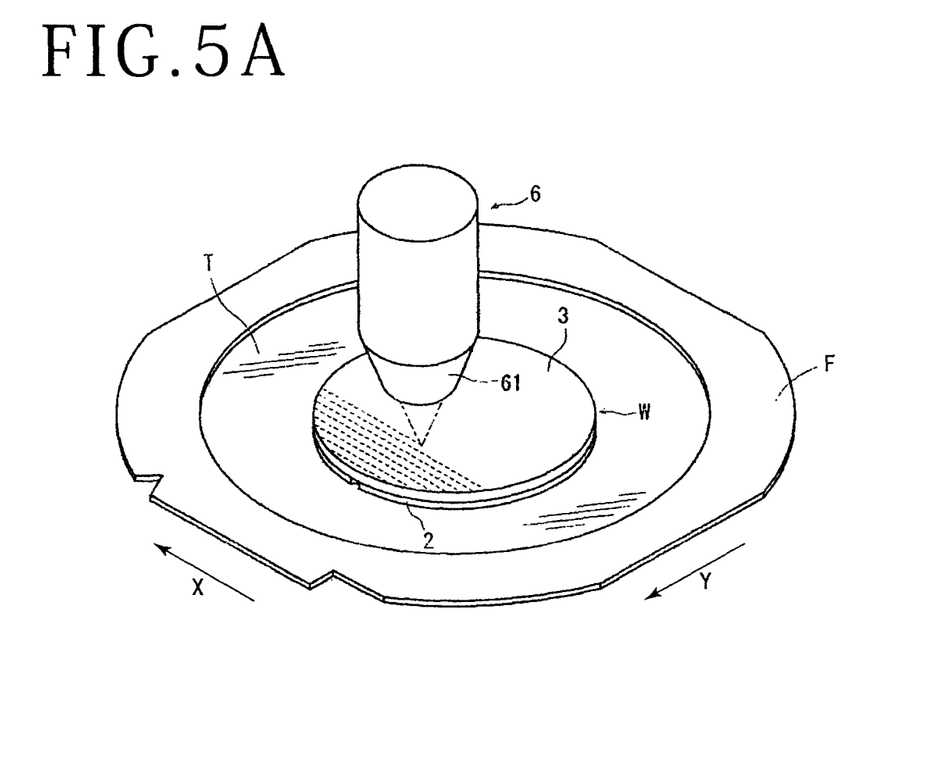
FIGS. 5A and 5B are views showing a bonding-material breaking step.

When the protective-member placing step has been finished, a bonding-material breaking step is performed using a laser processing apparatus provided with laser beam applying means 6 as shown in FIG. 5A. The laser processing apparatus may be of known nature and its overall structure and details thereof will not be described below as it has no direct bearing on the present invention.

Figure 5B:
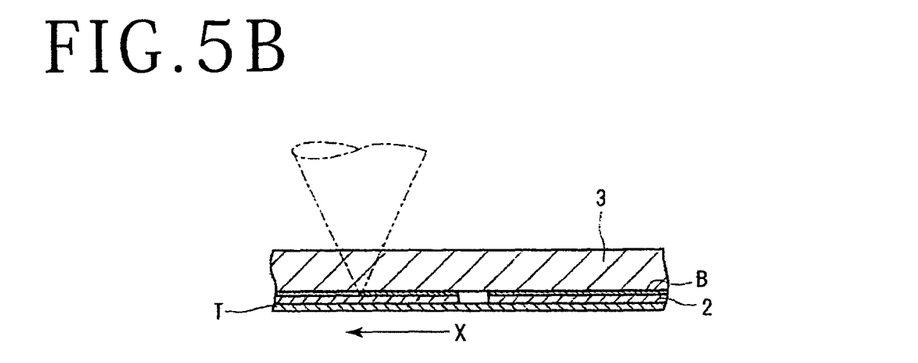

In preparation for the bonding-material breaking step shown in FIGS. 5A and 5B, the adhesive tape T of the bonded wafer W after performing the protective-member placing step is placed on a chuck table, not shown, of the laser processing apparatus. Suction means, not shown, is actuated to hold the bonded wafer W under suction on the chuck table through the adhesive tape T (wafer holding step). Although not shown in FIG. 5A, the annular frame F is held by an appropriate frame holding member disposed on the chuck table.

After the wafer holding step has been carried out as described above, the chuck table on which the bonded wafer W is held under suction is moved to a processing area where it is positioned directly below a beam condenser 61 of the laser beam applying means 6, as shown in FIG. 5A. Then, as shown in FIG. 5B, the laser beam applying means 6 is energized by a control signal from control means, not shown, to irradiate the bonding material B which bonds the supporting substrate 3 and the semiconductor wafer 2, from the side of the supporting substrate 3 of the bonded wafer W, with a pulsed laser beam having a wavelength which can transmit the supporting substrate 3 made of sapphire, for example, and which can be absorbed by the bonding material B made of epoxy resin, for example, thereby breaking the bonding material B. While the bonding material B is being thus irradiated with the pulsed laser beam, the chuck table is moved in the processing-feed direction indicated by an arrow X and in the indexing-feed direction indicated by an arrow Y, so that the focused spot of the pulsed laser beam emitted from the beam condenser 61 is controlled so as to be applied to the entire bonded surfaces of the semiconductor wafer 2 and supporting substrate 3 of the bonded wafer W (laser beam applying step). As a result, the bonding material B interposed between and bonding the semiconductor wafer 2 and the supporting substrate 3 is broken in its entirety, losing its bonding function to bond the semiconductor wafer 2 and the supporting substrate 3. The bonding-material breaking step is now finished.

Processing conditions in the laser beam applying step are given as follows, for example:
  Light source: YAG laser
  Wavelength: 355 nm
  Repetition frequency: 50 kHz
  Power: 0.2 W
  Spot diameter: 50 μm
  Pulse width: 10 ns
  Feed speed: 2000 mm/second
(Supporting-substrate Peeling Step)

Figure 6:
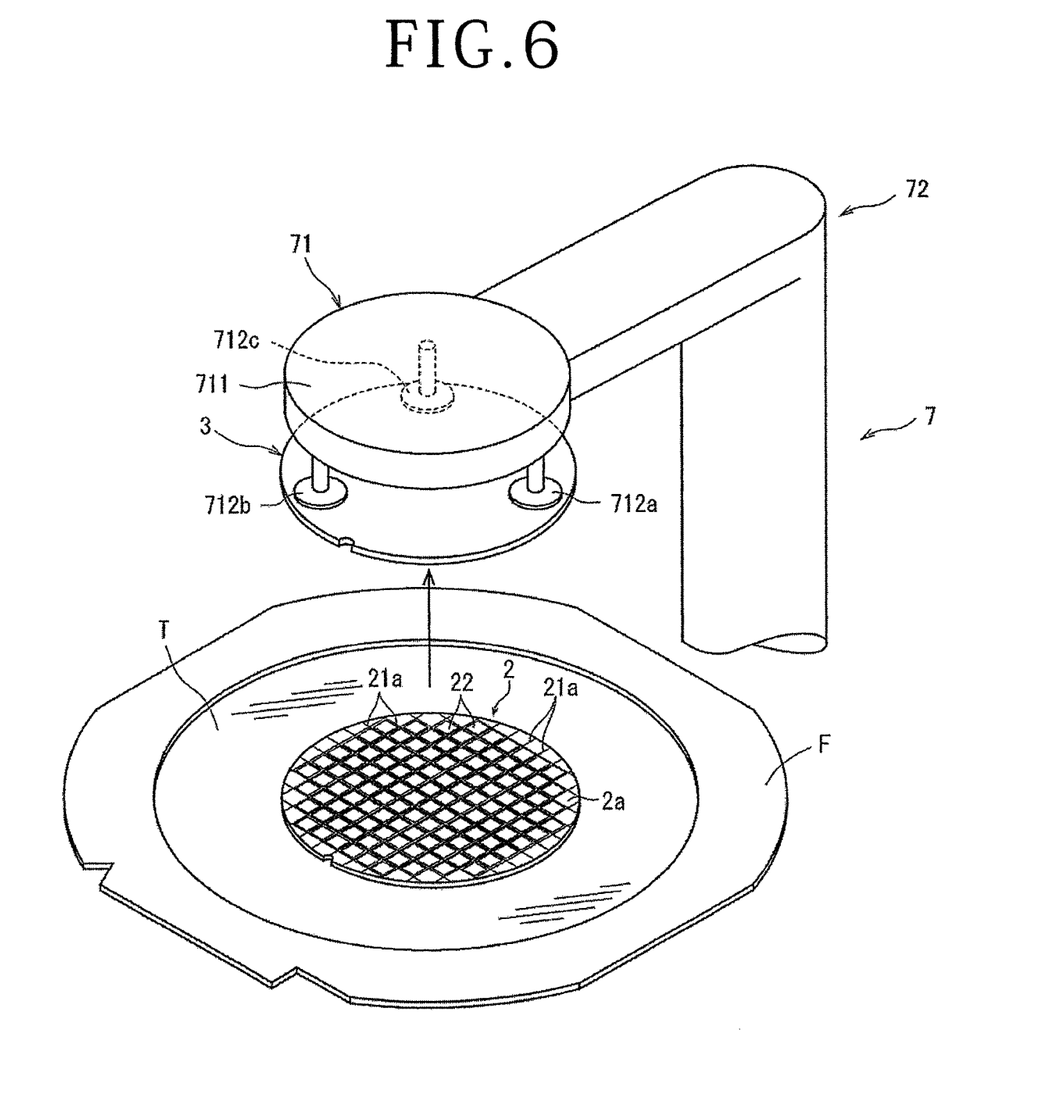
FIG. 6 is a perspective view showing a supporting-substrate-peeling step.

The bonding-material breaking step is followed by a supporting-substrate peeling step wherein the supporting substrate 3 is peeled off from the semiconductor wafer 2, separating the semiconductor wafer 2 into chips that carry the individual devices 22 thereon (see FIG. 6). When the bonding-material breaking step is finished, the chuck table on which the bonded wafer W is placed is moved to a peel-off position where a peeling mechanism 7 is disposed. In the peel-off position, the bonded wafer W held on the chuck table is positioned immediately below suction means 71 supported on support means 72 and the suction means 71 is lowered. Suction pads 712a through 712c supported through a suction passage 711 of the suction means 71 by the support means 72 are brought into contact with the supporting substrate 3. When the suction pads 712a through 712c contact the supporting substrate 3, suction means, not shown, is actuated to apply a negative pressure through the support means 72 and the suction passage 711 to the suction pads 712a through 712c, which attract the supporting substrate 3 under suction. When the suction pads 712a through 712c attract the supporting substrate 3 under suction, the suction pads 712a through 712c which are attracting the supporting substrate 3 under suction are moved upwardly away from the bonded wafer W, as shown in FIG. 6, thereby peeling the supporting substrate 3 off from the semiconductor wafer 2. The supporting-substrate peeling step is now finished. When the supporting-substrate peeling step is finished, the supporting substrate 3 which has been peeled off is housed in a supporting substrate container, not shown. The devices 22 which have been bonded to the supporting substrate 3 are now individually separately held on the adhesive tape T placed on the chuck table.
(Pickup Step)

After the supporting-substrate peeling step is finished, a pickup step is performed to pick up the devices 22 from the adhesive tape T. The pickup step is carried out by a pickup apparatus 8 which is fragmentarily shown in FIG. 7. The pickup apparatus 8 includes a frame holding member 81, a plurality of clamps 82 mounted on the frame holding member 81 for holding the annular frame F placed on an upper surface of the frame holding member 81, and an expanding drum 83 in the form of a hollow cylinder that is open in at least an upper end thereof, for expanding the adhesive tape T mounted on the annular frame F held in position by the clamps 82, with the individual devices 22 supported on the upper surface of the adhesive tape T. The frame holding member 81 is vertically movably supported by support means 823 which includes a plurality of air cylinders 823a disposed around the expanding drum 83 and a plurality of piston rods 823b extending upwardly from the respective air cylinders 823a.

Figure 7:
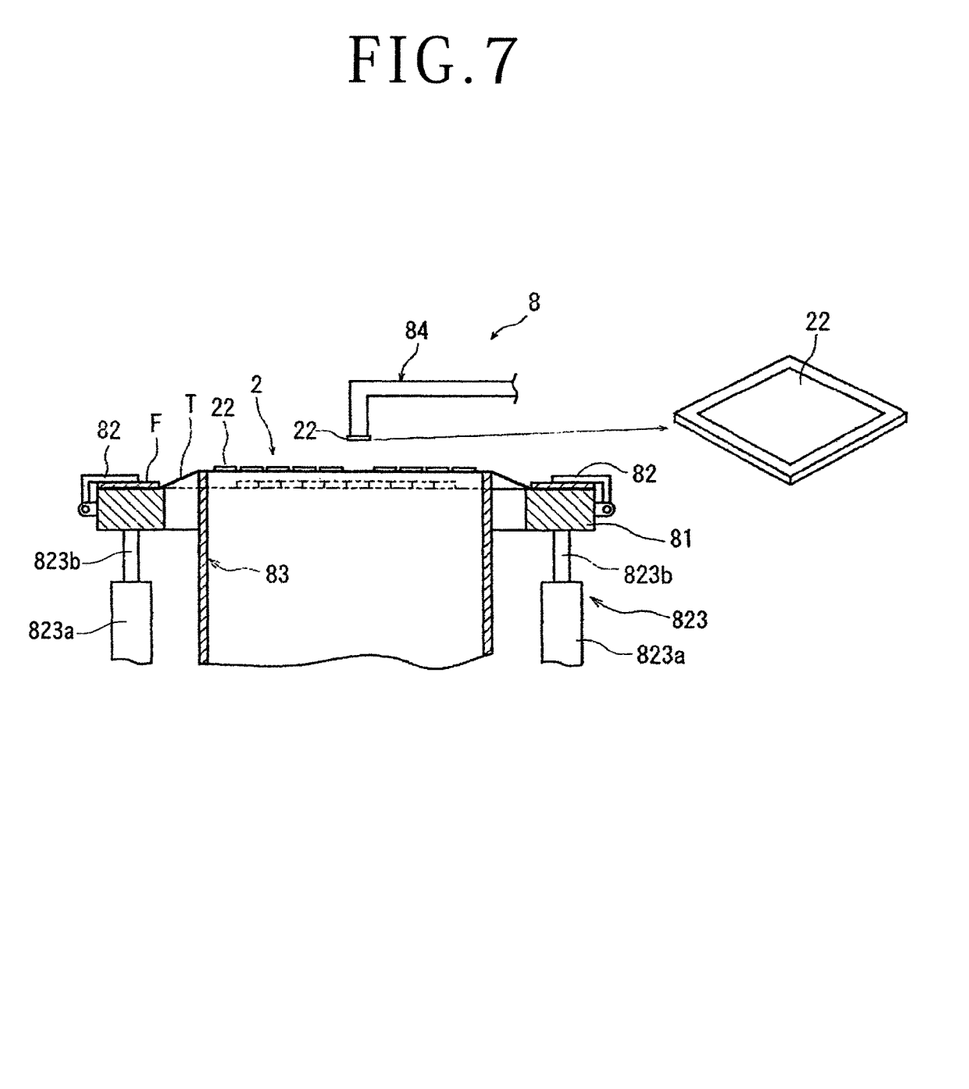
FIG. 7 is a cross-sectional view showing a pickup step.

The expanding drum 83 is of a diameter smaller than the inside diameter of the annular frame F and greater than the outside diameter of the semiconductor wafer 2 applied to the adhesive tape T mounted on the annular frame F. As shown in FIG. 7, the pickup apparatus 8 can selectively take a position, indicated by the dotted lines, where the frame holding member 81 and the upper end of the expanding drum 83 lie flush with each other and a position, indicated by the solid lines, where the frame holding member 81 is lowered by the support means 823 to make the upper end of the expanding drum 83 higher than the upper end of the frame holding member 81.

When the frame holding member 81 is lowered by the support means 823 to relatively change the upper end of the expanding drum 83 from the dotted-line position to the solid-line position where the upper end of the expanding drum 83 is higher than the upper end of the frame holding member 81, the adhesive tape T mounted on the annular frame F is expanded radially outwardly by contact with the upper end of the expanding drum 83. As a result, a tensile force is applied radially outwardly to the semiconductor wafer 2 applied to the adhesive tape T, spreading the intervals between the individual devices 22 that have already been separated. Then, a pickup collet 84 is actuated to pick up the devices 22, thus spaced apart, one by one off from the adhesive tape T, and carries them to a container tray, not shown. The pickup step is now finished, bringing an end to the method of processing a wafer according to the present invention. According to the present embodiment, the bonding material B is also cut as well as the semiconductor wafer 2 in the cutting step. However, the present invention is not limited to such cutting details. If the bonding material B is not fully severed, but remains uncut in the cutting step, then it is fully separated when the adhesive tape T is expanded in the pickup step.

With the above arrangement of the present invention, before the cut grooves are formed in the wafer along the division lines, the reverse side of the wafer is ground while the face side thereof is being supported by the supporting substrate. Therefore, since no individual devices are scattered or broken in the reverse-side grinding step, the present invention is advantageous in that smaller or thinner device chips which are of a square shape as small as 1 mm on each side or of a thickness of 10 µm or less can be manufactured with ease.

In the above embodiment, the cutting blade is used as specific means for carrying out the cutting step to form cut grooves along the division lines. However, the present invention is not limited to using the cutting blade. The means for forming cut grooves may be any of various cutting means such as a laser beam, plasma etching, wet etching, etc.

In the protective-member placing step according to the above embodiment, the wafer is placed in the opening of the annular frame, and the reverse side of the wafer and the outer periphery of the annular frame are joined to each other by the adhesive tape, so that the adhesive tape is placed as the protective member on the reverse side of the wafer by supporting the wafer on the annular frame. However, the present invention is not limited to such details of the protective-member placing step. A tape serving as a protective member that is identical in shape to the wafer may be applied to the reverse side of the wafer, or the face side of the wafer may be coated with a resin layer serving as a protective member.

In the above embodiment, the reverse-side grinding step is immediately followed by the cutting step. However, if the devices to be manufactured formed on the wafer are power devices, then a step of forming electrodes on the reverse side of the wafer is added between the reverse-side grinding step and the cutting step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer by dividing a wafer with devices formed on areas on a face side thereof which are demarcated by a plurality of division lines, along the division lines into chips that carry the individual devices thereon, the method comprising:
    an integrating step of placing a supporting substrate in confronting relation to the face side of the wafer and integrally bonding the supporting substrate to the face side of the wafer with a bonding material; followed by the step of
    a reverse-side grinding step of grinding a reverse side of the wafer to thin the wafer after performing the integrating step; followed by the step of
    a cutting step of cutting the wafer along the division lines from the ground reverse side of the wafer into the chips that carry the individual devices thereon; followed by the step of
    a protective-member placing step of placing a protective member on the reverse side of the wafer which has been cut along the division lines; followed by the step of
    a bonding-material breaking step of applying a laser beam having a wavelength which is able to transmit the supporting substrate in a condition where a focused spot of the laser beam is set in the bonding material, thereby breaking the bonding material; followed by the step of
    a supporting-substrate peeling step of peeling the supporting substrate off from the devices to separate the chips that carry the individual devices thereon.

2. The method of processing a wafer according to claim 1, wherein, in the protective-member placing step, the wafer is placed in an opening of a frame and the reverse side of the wafer and an inner periphery of the frame are joined to each other by an adhesive tape, so that the adhesive tape is placed as the protective member on the reverse side of the wafer by supporting the wafer on the frame, the method further comprising
    a pickup step of expanding the adhesive tape to expand intervals between the devices, and picking up the devices from the adhesive tape after performing the supporting-substrate peeling step.

3. The method of processing a wafer according to claim 1, wherein the cutting step includes any one of a cutting step using a cutting blade, a cutting step using a laser beam, a cutting step using plasma etching, and a cutting step using wet etching.

* * * * *